(12) United States Patent
Motomura

(10) Patent No.: US 11,084,941 B2
(45) Date of Patent: Aug. 10, 2021

(54) UNDERFILL MATERIAL, UNDERFILL FILM, AND METHOD FOR MANUFACTURING SEMICONDUCTOR DEVICE USING SAME

(71) Applicant: DEXERIALS CORPORATION, Tokyo (JP)

(72) Inventor: Daisuke Motomura, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/687,191

(22) Filed: Nov. 18, 2019

(65) Prior Publication Data

US 2020/0109292 A1   Apr. 9, 2020

Related U.S. Application Data

(63) Continuation of application No. PCT/JP2018/018864, filed on May 16, 2018.

(30) Foreign Application Priority Data

May 16, 2017   (JP) .............................. JP2017-097537

(51) Int. Cl.
    *C09D 4/06*      (2006.01)
    *C09D 133/00*    (2006.01)
    (Continued)

(52) U.S. Cl.
    CPC .............. *C09D 4/06* (2013.01); *C09D 133/00* (2013.01); *C09D 133/16* (2013.01);
    (Continued)

(58) Field of Classification Search
    None
    See application file for complete search history.

(56) References Cited

U.S. PATENT DOCUMENTS

2005/0008873 A1   1/2005   Noro et al.
2005/0222330 A1   10/2005  Takano
(Continued)

FOREIGN PATENT DOCUMENTS

JP   2005-28734 A    2/2005
JP   2006-335817 A   12/2006
(Continued)

OTHER PUBLICATIONS

Jul. 24, 2018 International Search Report issued in International Patent Application No. PCT/JP2018/018864.
May 13, 2019 International Preliminary Report on Patentability issued in International Patent Application No. PCT/JP2018/018864.
Mar. 18, 2021 Office Action issued in Korean Patent Application No. 10-2019-7032035.

*Primary Examiner* — Evren Seven
(74) *Attorney, Agent, or Firm* — Oliff PLC

(57) ABSTRACT

Provided are an underfill material capable of realizing low-pressure mounting and voidless mounting, and a method for manufacturing a semiconductor device using the same. The underfill material includes a main composition containing an acrylic polymer, an acrylic monomer, and a maleimide compound, and the acrylic polymer is contained in a range of 10 parts by mass or more and 60 parts by mass or less in 100 parts by mass of the main composition, and the maleimide compound is contained in a range of 20 parts by mass or more and 70 parts by mass or less in 100 parts by mass of the main composition. Low-pressure mounting and the voidless mounting can be realized.

18 Claims, 8 Drawing Sheets

(51) Int. Cl.
*C09D 133/16* (2006.01)
*H01L 21/48* (2006.01)
*H01L 21/56* (2006.01)
*H01L 23/29* (2006.01)
*H01L 23/31* (2006.01)
*H01L 23/00* (2006.01)

(52) U.S. Cl.
CPC ........ *H01L 21/4853* (2013.01); *H01L 21/563* (2013.01); *H01L 23/293* (2013.01); *H01L 23/3157* (2013.01); *H01L 24/16* (2013.01); *H01L 2224/16227* (2013.01); *H01L 2924/18161* (2013.01)

(56) References Cited

U.S. PATENT DOCUMENTS

| | | |
|---|---|---|
| 2009/0166897 A1 | 7/2009 | Katsurayama et al. |
| 2016/0190094 A1 | 6/2016 | Yoko et al. |
| 2018/0079939 A1 | 3/2018 | Kubota et al. |

FOREIGN PATENT DOCUMENTS

| | | |
|---|---|---|
| JP | 2014-169450 A | 9/2014 |
| JP | 2015-503220 A | 1/2015 |
| JP | 2016-146412 A | 8/2016 |
| KR | 10-2014-0068929 A | 6/2014 |
| KR | 10-2014-0088543 A | 7/2014 |
| WO | 2016/152271 A1 | 9/2016 |

UNDERFILL MATERIAL, UNDERFILL FILM, AND METHOD FOR MANUFACTURING SEMICONDUCTOR DEVICE USING SAME

TECHNICAL FIELD

The disclosed embodiments generally relate to an underfill material, an underfill film, and a method for manufacturing a semiconductor device using the same.

BACKGROUND ART

In recent years, in a method for mounting a semiconductor chip, a "pre-applied underfill film (PUF)", in which an underfill film is attached on an electrode of a semiconductor integrated circuit (IC), has been considered for the purpose of process shortening. The mounting method using this pre-applied underfill film is performed, for example, as follows (refer to Patent Literature 1).

Step A: An underfill film is attached to a wafer, and the wafer is diced to obtain a semiconductor chip.

Step B: With the underfill film attached, the semiconductor chip is aligned and placed on a circuit board.

Step C: The semiconductor chip is thermocompression-adhered to ensure conduction by metal bond of solder bumps and to perform adhesion by curing the underfill film.

In the method for mounting a semiconductor chip, as an adhesive for adhering the solder bumps, for example, a thermosetting adhesive using an epoxy resin has been proposed (refer to Patent Literature 2). Furthermore, from the viewpoint of low hygroscopicity, excellent curability, and long working life (pot life), curable resins, such as, bismaleimides have also been considered (refer to Patent Literature 3).

With regard to an underfill technology, in recent years, an underfill material for obtaining an underfill film which is capable of achieving low-pressure mounting and voidless mounting has been demanded.

CITATION LIST

Patent Literature

Patent Literature 1: JP 2005-028734 A
Patent Literature 2: JP 2006-335817 A
Patent Literature 3: JP 2014-169450 A

Summary Technical Problem

The present technology has been created in view of such a conventional circumstance, and provides an underfill material capable of performing low-pressure mounting and voidless mounting, an underfill film, and a method for manufacturing a semiconductor device using the same.

Solution to Problem

The inventors of the present invention have found that it is possible to solve the problem by using an underfill material containing an acrylic polymer, an acrylic monomer, and the maleimide compound as a main composition, and by setting the contents of the acrylic polymer and the maleimide compound to be in a specific range.

The present embodiment is an underfill material that is an uncured underfill material arranged between a semiconductor chip and a circuit board, and that fixes the semiconductor chip to the circuit board by curing, the underfill material including a main composition consisting of an acrylic polymer, an acrylic monomer, and a maleimide compound, wherein the acrylic polymer is included in a range of at least 10 parts by mass and at most 60 parts by mass in 100 parts by mass of a main composition, and the maleimide compound is included in a range of at least 20 parts by mass and at most 70 parts by mass in 100 parts by mass of the main composition.

The acrylic monomer may be included in the range of at least 10 parts by mass and at most 60 parts by mass in 100 parts by mass of the main composition.

The acrylic polymer may have a weight-average molecular weight Mw in a range of at least 100,000 and at most 1,200,000.

The acrylic monomer may include a fluorene acrylate.

The maleimide compound can include at least two maleimide groups in one molecule.

The maleimide compound may be bismaleimide.

The underfill material can further comprise a phenol compound.

An embodiment is the underfill film that is an uncured underfill film arranged between a semiconductor chip and a circuit board, and that fixes the semiconductor chip to the circuit board when cured, and the underfill film including a main composition consisting of an acrylic polymer, an acrylic monomer, and a maleimide compound, wherein the acrylic polymer is in a range of at least 10 parts by mass and to at most 60 parts by mass in 100 parts by mass of a main composition, and the maleimide compound is in a range of at least 20 parts by mass and at most 70 parts by mass in 100 parts by mass of the main composition.

The acrylic monomer may be included in the range of at least 10 parts by mass and at most 60 parts by mass in 100 parts by mass of the main composition.

The acrylic polymer may have a weight average molecular weight Mw in a range of at least 100,000 and at most 1,200,000.

The acrylic monomer may include a fluorene acrylate.

The maleimide compound can include at least two maleimide groups in one molecule.

The maleimide compound may be bismaleimide.

The underfill film can further comprise a phenol compound.

of the underfill film can have a tensile breaking strength in a range of at least 0.01 MPa and at most 5.0 Mpa.

Provided is a method for manufacturing a semiconductor device, the method including disposing an uncured underfill film between a surface of a semiconductor chip on which a bump is provided and a surface of a circuit board, and adhering the semiconductor chip and the circuit board using the underfill film, wherein the underfill film includes a main composition consisting of an acrylic polymer, an acrylic monomer, and a maleimide compound, the acrylic polymer is included in a range at least of 10 parts by mass and at most 60 parts by mass in 100 parts by mass of a main composition, and wherein the maleimide compound is included in a range of at least 20 parts by mass and at most 70 parts by mass in 100 parts by mass of the main composition.

The method can further include a temporary fixing step of pressing and heating the semiconductor chip to the circuit board in a state where the underfill film is disposed between the semiconductor chip and the circuit board, pushing out a part of the underfill film positioned between the semiconductor chip and the circuit board from between the semiconductor chip and the circuit board, and bringing a bump of the semiconductor chip into contact with a substrate electrode of the circuit board; and a mounting step of increasing temperatures of the semiconductor chip, the circuit board, and the underfill film higher than the temperature increased in the temporary fixing step, melting the bump, and then, decreasing the temperature of the semiconductor chip, the underfill film, and the circuit board, and solidifying the melted bump in a state that the bump is in contact with the substrate electrode.

The maleimide compound and the acrylic monomer used in the present embodiments can form a copolymer by causing a copolymerization reaction to proceed by heating or ultraviolet irradiation. The acrylic polymer and the copolymer are polymer-compatible, and a stable underfill material and an underfill film having long-term performance can be obtained without deterioration.

Because a copolymer of the maleimide compound and the acrylic monomer is excellent in heat resistance, and the close adhesion between the copolymer and the semiconductor chip and the close adhesion between the copolymer and the circuit board are also high, peeling of the semiconductor chip does not occur.

Advantageous Effects

According to the present embodiments, the underfill material can be fluidized by heating, and can be mounted with a small pressing force. Furthermore, because the copolymerization reaction does not generate bubbles, the semiconductor chip can be mounted without including bubbles between the semiconductor chip and the circuit board.

DESCRIPTION OF EMBODIMENTS

Figure 1:
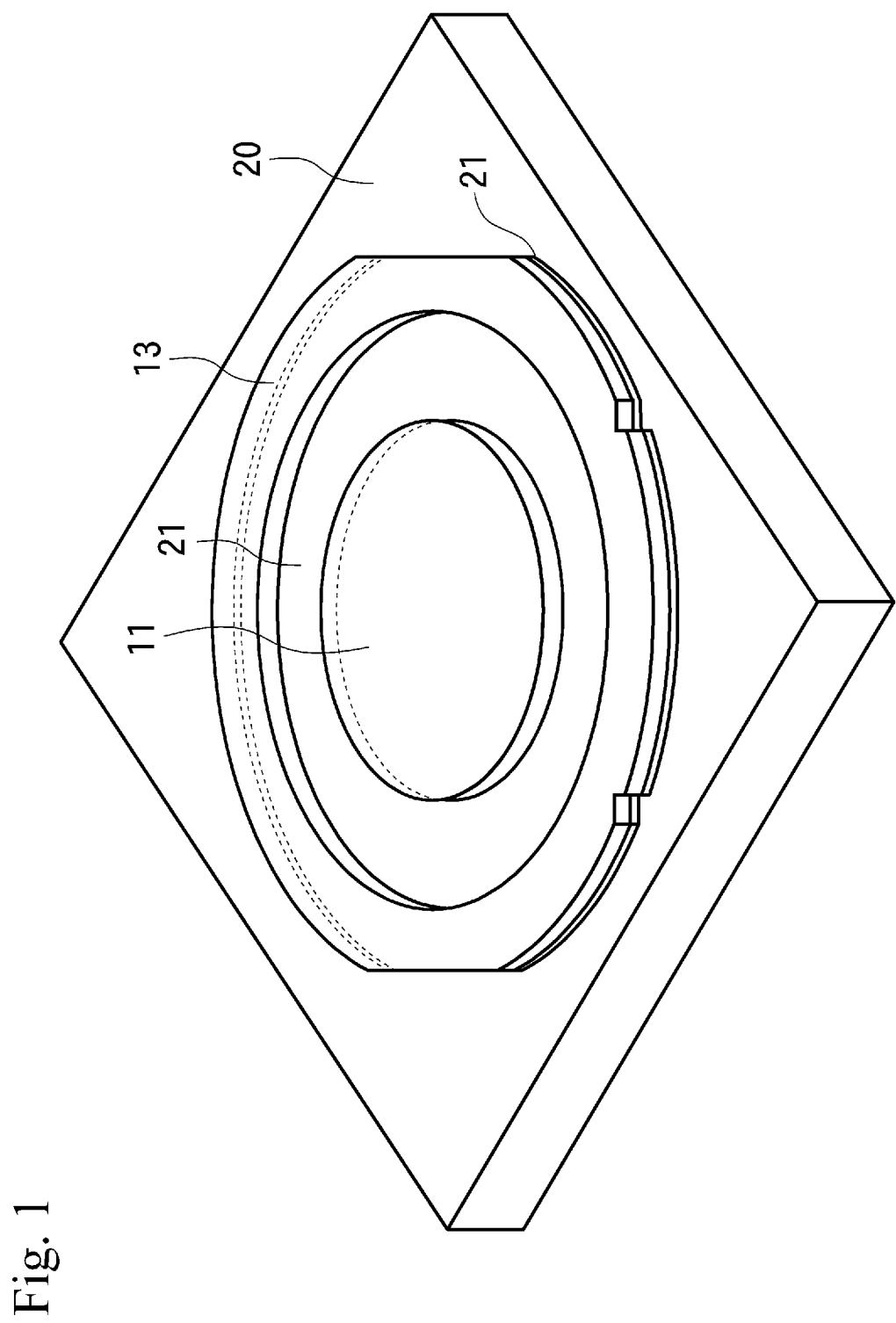
FIG. 1 is a perspective view for showing a state where a jig and a wafer are attached to a dicing film.

Hereinafter, embodiments of the present invention will be described in detail.

<Underfill Material>

The underfill material of the present embodiments is a material which forms an underfill film, and includes a main composition including an acrylic polymer, an acrylic monomer, and a maleimide compound.

[Acrylic Polymer]

The acrylic polymer is a polymer having a constitutional unit derived from a (meth)acrylate component, and is preferably a polymer that does not cause the tackiness of the underfill material to be too strong, and has a low risk of impairing workability in a mounting step of a semiconductor. Examples of the (meth)acrylate component including, for example, methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth) acrylate, hexyl (meth)acrylate, 2-ethylhexyl (meth)acrylate, heptyl (meth)acrylate, octyl heptyl (meth)acrylate, nonyl (meth)acrylate, decyl (meth)acrylate, undecyl (meth)acrylate, and lauryl (meth)acrylate can be used.

In addition to the (meth)acrylate component discussed above, the acrylic polymer may further have a constitutional unit corresponding to another monomer component copolymerizable with the (meth)acrylate component discussed above. As other monomer components, for example, a carboxyl group-containing monomer (for example, (meth)acrylic acid), an epoxy group-containing monomer (for example, glycidyl (meth)acrylate), and a nitrile group-containing monomer (for example, acrylonitrile) can be used.

For example, as an acrylic polymer, those containing a constitutional unit corresponding to butyl acrylate, methyl acrylate, acrylic acid, glycidyl methacrylate, and acrylonitrile can be used.

The acrylic polymer can be obtained by polymerizing the above-discussed (meth)acrylate component and other monomer components. Examples of a polymerization method include solution polymerization, emulsion polymerization, bulk polymerization, and suspension polymerization. The kinds of polymerization reactions of the acrylic polymer include, for example, radical polymerization, cationic polymerization, anionic polymerization, living radical polymerization, living cationic polymerization, living anion polymerization, and coordination polymerization.

A weight average molecular weight (Mw) of the acrylic polymer is not particularly limited, and for example, it can be within a range of at least 100,000 and at most 1,200,000, and within a range of at least 500,000 and at most 1,000,000.

When an acrylic polymer, an acrylic monomer, and a maleimide compound in the underfill material are referred to as a main composition, the acrylic polymer is included in a range of at least 10 parts by mass and at most 60 parts by mass, preferably in at least a range of 10 parts by mass and at most 45 parts by mass, and more preferably in a range of at least 15 parts by mass and at most 40 parts by mass, in 100 parts by mass of the main composition. When the content of the acrylic polymer is less than 10 parts by mass, it tends to be difficult to eliminate voids. Moreover, when the content of the acrylic polymer exceeds 60 parts by mass, it tends to be difficult to realize low-pressure mounting, and the connectivity tends to deteriorate.

The acrylic polymer may include one kind of acrylic polymer alone in the main composition, or may include two or more kinds of acrylic polymers in combination. In a case where two or more kinds of acrylic polymers are used in combination, the total content of the acrylic polymers in the underfill material is preferably within the above-discussed range.

[Acrylic Monomer]

As the acrylic monomer, monofunctional (meth)acrylate and bifunctional or higher (meth)acrylate can be used. Examples of the acrylic monomer include isocyanuric acid EO-modified diacrylate (prepared by Toagosei Co., Ltd.), isocyanuric acid EO-modified triacrylate (prepared by Toagosei Co., Ltd.), dipentaerythritol and tetraacrylate (prepared by Toagosei Co., Ltd.), 2-hydroxy-3-phenoxypropyl acrylate (prepared by Toagosei Co., Ltd.), 9,9-bis[4-(2-acryloyloxyethoxy) phenyl] fluorene (prepared by Shin-Nakamura Chemical Co., Ltd.), tricyclodecane dimethanol diacrylate (prepared by Shin-Nakamura Chemical Co., Ltd.), ethoxylated bisphenol A diacrylate (prepared by Shin-Nakamura Chemical Co., Ltd.), and fluorene acrylate (for example, sold under the names: OGSOL EA0200, EA0300, prepared by Osaka Gas Chemicals Co., Ltd.). Among these acrylic monomers, in consideration of heat resistance and the like, a fluorene acrylate having high heat resistance is preferable.

The acrylic monomer in the underfill material can be included in a range of at least 10 parts by mass and at most 60 parts by mass, preferably in a range of at least 10 parts by mass and at most 55 parts by mass, and more preferably in a range of at least 10 parts by mass and at most 50 parts by mass, in 100 parts by mass of the main composition. When the content of the acrylic monomer is less than 10 parts by mass, the connectivity tends to deteriorate. Furthermore, when the content of the acrylic monomer exceeds 60 parts by mass, it tends to be difficult to eliminate voids.

The acrylic monomer may include one kind of acrylic monomer alone, or may include two or more kinds of acrylic monomers in combination. In a case where two or more kinds of acrylic monomers are used in combination, the total content of the acrylic monomers in the underfill material is preferably within the above-discussed range.

[Maleimide Compound]

As the maleimide compound, for example, a compound having at least two maleimide groups in one molecule can be used, and bismaleimide is preferable. Examples of the maleimide compound include 4-methyl-1,3-phenylene bismaleimide, 4,4-bismaleimide diphenylmethane, m-phenylene bismaleimide, bisphenol A diphenyl ether bismaleimide, and 3,3'-dimethyl-5,5'-diethyl-4,4'-diphenylmethane bismaleimide. Among these, aromatic bismaleimide is preferable, and in consideration of the workability in the manufacturing step of the underfill film, 3,3'-dimethyl-5,5'-diethyl-4,4'-diphenylmethane bismaleimide which is excellent in solvent solubility and flowability is particularly preferable.

The maleimide compound in the underfill material is included in a range of at least 20 parts by mass and at most 70 parts by mass, preferably in a range of at least 20 parts by mass and at most 60 parts by mass, and more preferably in a range of at least 20 parts by mass and at most 55 parts by mass, in 100 parts by mass of the main composition. When the content of the maleimide compound is less than 20 parts by mass, it tends to be difficult to realize low-pressure mounting, and the connectivity tends to deteriorate. Furthermore, when the content of the maleimide compound exceeds 70 parts by mass, the low-pressure mounting and voidless mounting tend to be difficult.

Depending on the purpose, the composition used for the underfill material may further include components other than the components constituting the main composition discussed above. Examples of other components include a phenol compound and a filler.

[Phenol Compound]

The phenol compound can be used as a curing agent for the maleimide compound discussed above, but the thermosetting reaction can be initiated without including phenol. As the phenol compound, for example, allylated bisphenol can be used, and specifically, 2,2'-diallylbisphenol A (sold under the name: DABPA), 4,4'-(dimethylmethylene) bis[2-(2-propenyl) phenol], 4,4'-methylenebis [2-(2-propenyl) phenol], and 4,4'-(dimethylmethylene) bis[2-(2-propenyl)-6-methylphenol] can be used. Among these, 2,2'-diallylbisphenol A is preferable.

In a case where the phenol compound is included, the content of the phenol compound can be, for example, at most 15 parts by mass with respect to 100 parts by mass in total of the acrylic polymer, the acrylic monomer, the maleimide compound, and the phenol compound. The phenol compound may include one kind of phenol compound alone, or may contain two or more kinds of phenol compounds in combination. In a case where two or more kinds of phenol compounds are used in combination, the total content of the phenol compounds in the underfill material is preferably within the above-discussed range.

[Filler]

As the filler, an inorganic filler, an organic filler, conductive particles, and the like can be used. In particular, it is preferable to use an inorganic filler (for example, a silica filler) from the viewpoint of reducing the linear expansion coefficient and improving the reliability.

In a case of using the filler, the content of the filler can be, for example, at most 30 parts by mass with respect to 100 parts by mass in total of the acrylic polymer, the acrylic monomer, the maleimide compound, and the filler. The filler may include one kind of filler alone, or may include two or more kinds of fillers in combination. In a case where two or more kinds of fillers are used in combination, the total content of the fillers in the underfill material is preferably within the above-discussed range.

As discussed above, the underfill material according to the present embodiment includes the main composition, and the acrylic polymer is contained in the range of at least 10 parts by mass and at most 60 parts by mass in 100 parts by mass of the main composition. Further, the underfill material includes the maleimide compound in a range of at least 20 parts by mass and at most 70 parts by mass with respect to 100 parts by mass of the main composition. The acrylic monomer can be included in a range of at least 10 parts by mass and at most 60 parts by mass in 100 parts by mass of the main composition.

By using such an underfill material, the low-pressure mounting and the voidless mounting can be realized, and connectivity can be improved. Furthermore, by achieving the low-pressure mounting, it is possible to reduce the degree of chip warping and to suppress flowing of solder during mounting. In addition, it is possible to cope with the increase in the number of pins (bumps) of the chip by a pressing force of a general-purpose bonder. In order to achieve the low-pressure mounting and the voidless mounting, for example, a method of lowering the elastic modulus (lowering viscosity) of the underfill material is also conceivable. However, in this method, void removability tends to deteriorate.

The underfill material discussed above can be used, for example, as an underfill film in which the underfill material is formed in a film shape. An example of a method for manufacturing such an underfill film will be discussed. First, a composition containing the above-discussed acrylic polymer, acrylic monomer, and maleimide compound is dissolved in a solvent to produce an underfill material. As the solvent, for example, toluene, ethyl acetate, or a mixed solvent thereof can be used.

Figure 7A:
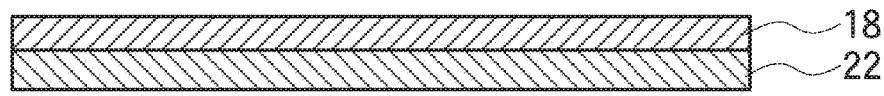
FIG. 7A is a cross-sectional view for showing a step of applying a composition.

Next, the produced underfill material is applied on a release substrate. A reference numeral 22 in FIG. 7A denotes the release substrate, and a film-shaped underfill material layer 18 formed by application is formed thereon. Applying the underfill material can be performed by using, for example, a coating device. The release substrate 22 has a laminated structure in which a release agent such as silicone is applied to poly ethylene terephthalate (PET), oriented polypropylene (OPP), poly-4-methlpentene-1 (PMP), polytetrafluoroethylene (PTFE), and the like, and prevents the composition from drying and maintains the shape of the composition.

Figure 7B:
FIG. 7B is a cross-sectional view for showing a step of drying the applied composition layer.

Next, the underfill material layer 18 applied on the release substrate 22 is dried by a heat oven, a heat drying device, or the like. As a result, as illustrated in FIG. 7B, an underfill film 12 having a predetermined thickness is formed on a surface of the release substrate 22.

Because the underfill film 12 using the underfill material according to the present embodiments is in a solid state at room temperature (at least 5° C. and at most 35° C.: JIS Z 8703), it is possible to prevent device contamination, uneven thickness, and the like, which makes it easy to handle and provides excellent adhesion reliability. On the other hand, in the techniques disclosed in Patent Literatures 2 and 3 discussed above, because a curable resin that is in a liquid state at room temperature is used, device contamination, uneven thickness, or the like can occur, and it tends to be difficult to handle. Furthermore, in the techniques disclosed in Patent Literatures 2 and 3 discussed above, an adhesive is scattered and deformed in a dicing step of dividing a semiconductor element into pieces, which causes adhesion reliability to be impaired.

In addition, the underfill film 12 according to the present embodiment has a value of a tensile breaking strength in a state before curing within a range of at least 0.01 MPa and at most 5.0 MPa, at least 0.1 MPa and at most 3.0 MPa, and at least 0.3 MPa and at most 1.0 MPa. The tensile breaking strength refers to a value measured by an evaluation method of a film breaking strength discussed later.

<Method for Manufacturing Semiconductor Device>

Next, an example of a method for manufacturing a semiconductor device using the above-discussed underfill film 12 will be described. A method for manufacturing a semiconductor device includes, for example, attaching the underfill film 12 on a wafer, dicing the wafer, picking up a semiconductor chip, and mounting the semiconductor chip on a circuit board.

A reference numeral 13 in FIG. 1 denotes a jig that is a ring-shaped frame, and a dicing film 21 is attached to a back surface of the jig 13. An adhesive surface of the dicing film 21 is exposed to the inside of the ring-shaped jig 13. On the dicing film 21 in the inside of the jig 13, a wafer 11 having a smaller diameter than the inner periphery of the jig 13 is attached, so that the wafer 11 is fixed to the jig 13. The jig 13 and the wafer 11 are arranged on a table 20 in a state of being attached to the dicing film 21.

Figure 8A:
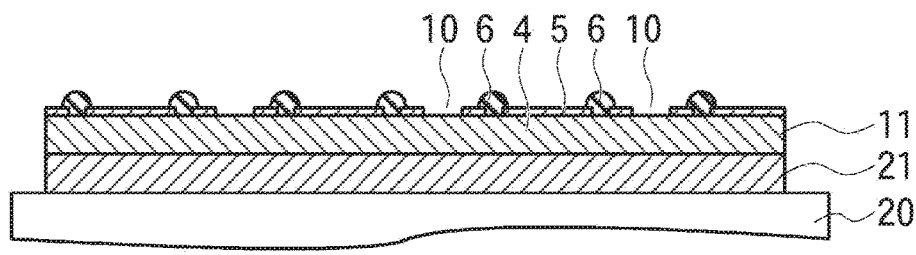
FIGS. 8A-8D are cross-sectional views for showing a step of manufacturing the semiconductor device.

FIG. 8A is a cross-sectional view of the dicing film 21 and the wafer 11, and the wafer 11 has circuit portions 4 of a plurality of integrated circuits (ICs) formed thereon, and each circuit portion 4 is divided by a scribe line 10.

On the surface of a predetermined location in the circuit portion 4, bumps 6 electrically connected to an electric circuit formed in the circuit portion 4 are provided. Among the electronic circuits inside the circuit portion 4, locations other than the parts connected to the bump 6 are insulated from the bump 6 by an insulating film 5. In FIG. 1 to FIG. 5, the bump 6 and the scribe line 10 are omitted.

Between the two surfaces of the wafer 11, the underfill film 12 is attached to the surface on which the bumps 6 are formed.

Figure 2:
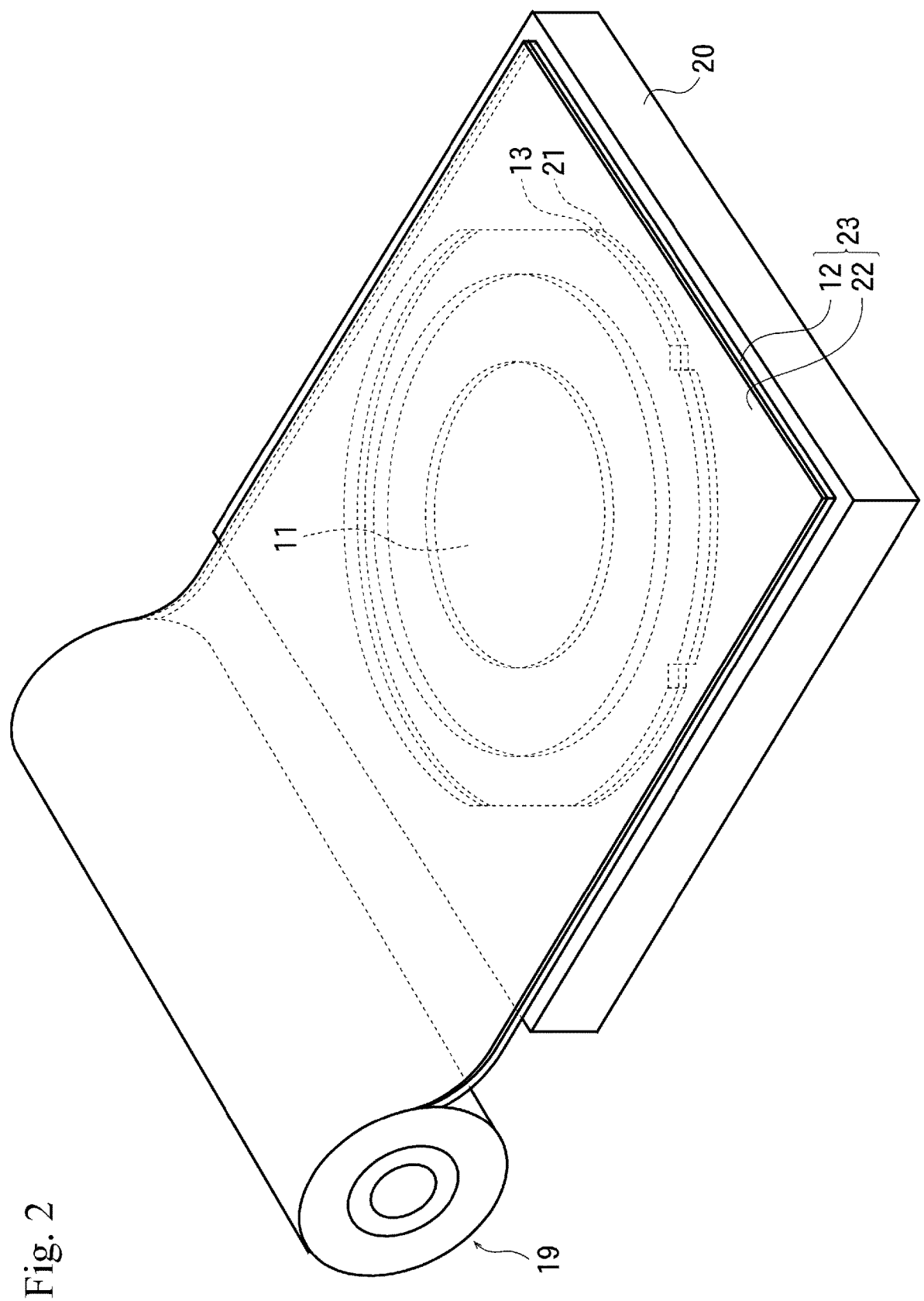
FIG. 2 is a perspective view for showing an example of a step of attaching an underfill film on the wafer.
Figure 8B:
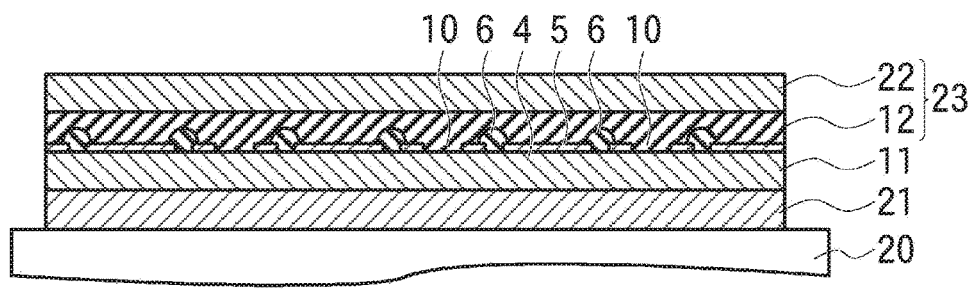

A reference numeral 19 in FIG. 2 denotes a roll on which an underfill film with release paper (collectively designated with reference numeral 23), which is formed of the film-shaped release substrate 22 and the underfill film 12 attached to the release substrate 22, is wound. The underfill film with release paper 23 is unwound from this roll 19, the surface to which the underfill film 12 is exposed is brought into contact with the jig 13 and the wafer 11 and pressed so that the underfill film 12 is attached to the wafer 11. FIG. 8B is a cross-sectional view of the dicing film 21 and the wafer 11 to which the underfill film with release paper 23 is attached.

The underfill film 12 is adhered to the back surface of the wafer 11 instead of the dicing film 21, and the underfill film 12 can function as a dicing film that protects and fixes the wafer 11 when the wafer 11 is diced and holds it during pick-up.

Figure 8C:
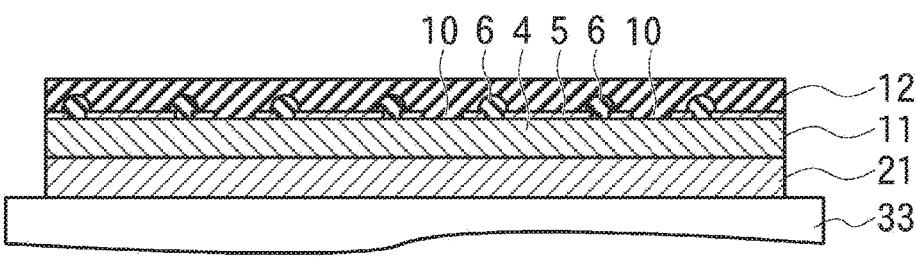

FIG. 8C shows a state where the underfill film with release paper 23 attached to the wafer 11 is cut and separated from the roll 19, and then the release substrate 22 is removed from the underfill film with release paper 23 attached to the wafer 11, and the wafer 11 to which the underfill film 12 is attached is moved onto a table 33 of the dicing device while being attached to the dicing film 21.

Figure 3:
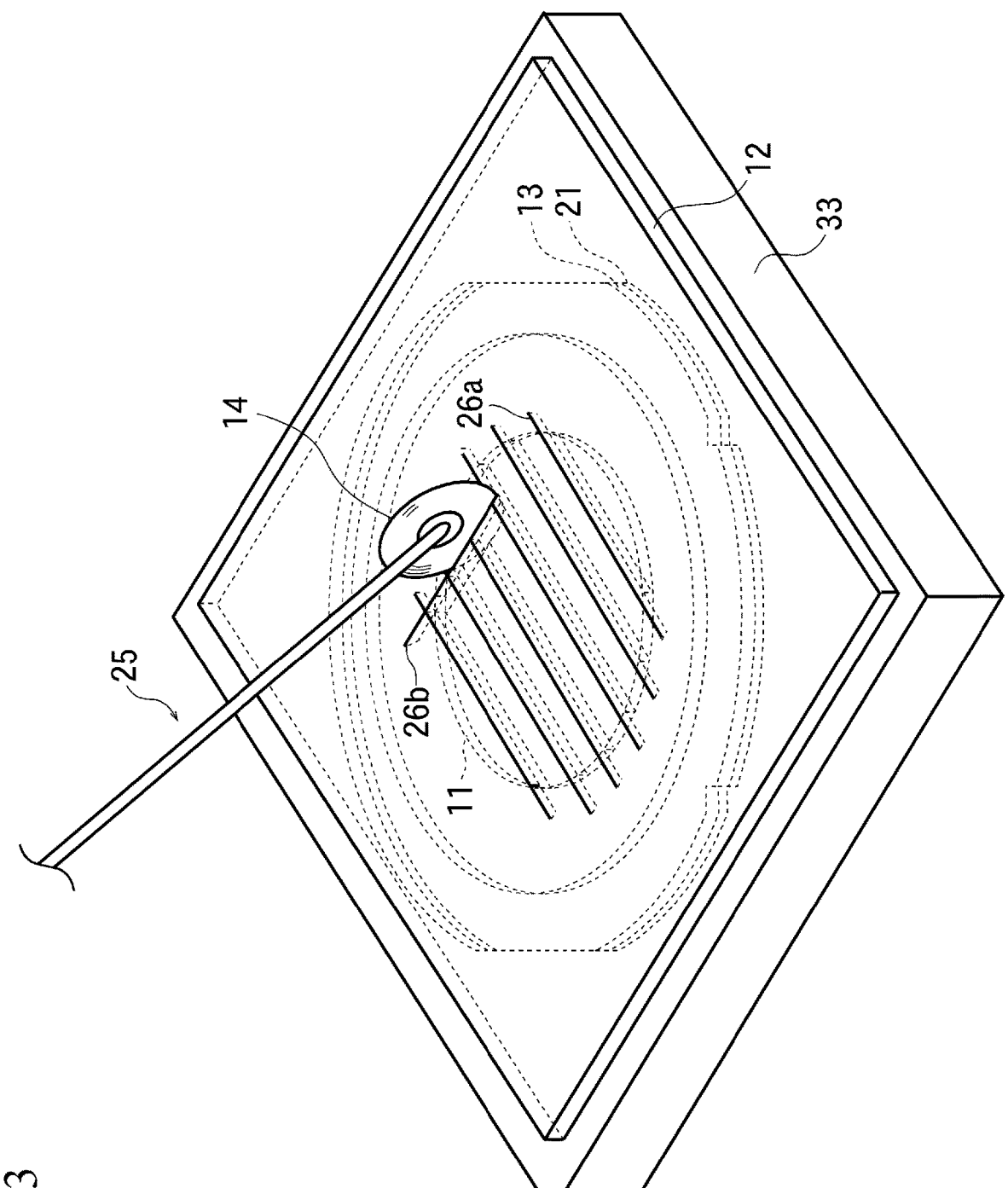
FIG. 3 is a perspective view for showing an example of a step of dicing the wafer.

Next, FIG. 3 is a perspective view for showing an example of a dicing step of dividing the wafer 11, in which a disk-shaped blade 14 provided in a cutting tool 25 is brought into contact with the surface of the underfill film 12 while being rotated, is descended while being pressed to cut the underfill film 12, and is brought into contact with the scribe line 10 of the wafer 11. In this state, the blade 14 is further pressed to cut the wafer 11 and the underfill film 12 together as the blade 14 is descended. The descending of the blade 14 is stopped before the dicing film 21 is cut after the blade 14 passes through the wafer 11 so that the wafer 11 is cut by moving a linear portion where the scribe line 10 of the wafer 11 is formed, and the blade 14 moves along the scribe line 10 to cut the wafer 11 in a state of being parallel to the dicing film 21. Reference numerals 26a and 26b are cut surfaces formed by cutting the wafer 11.

Figure 4:
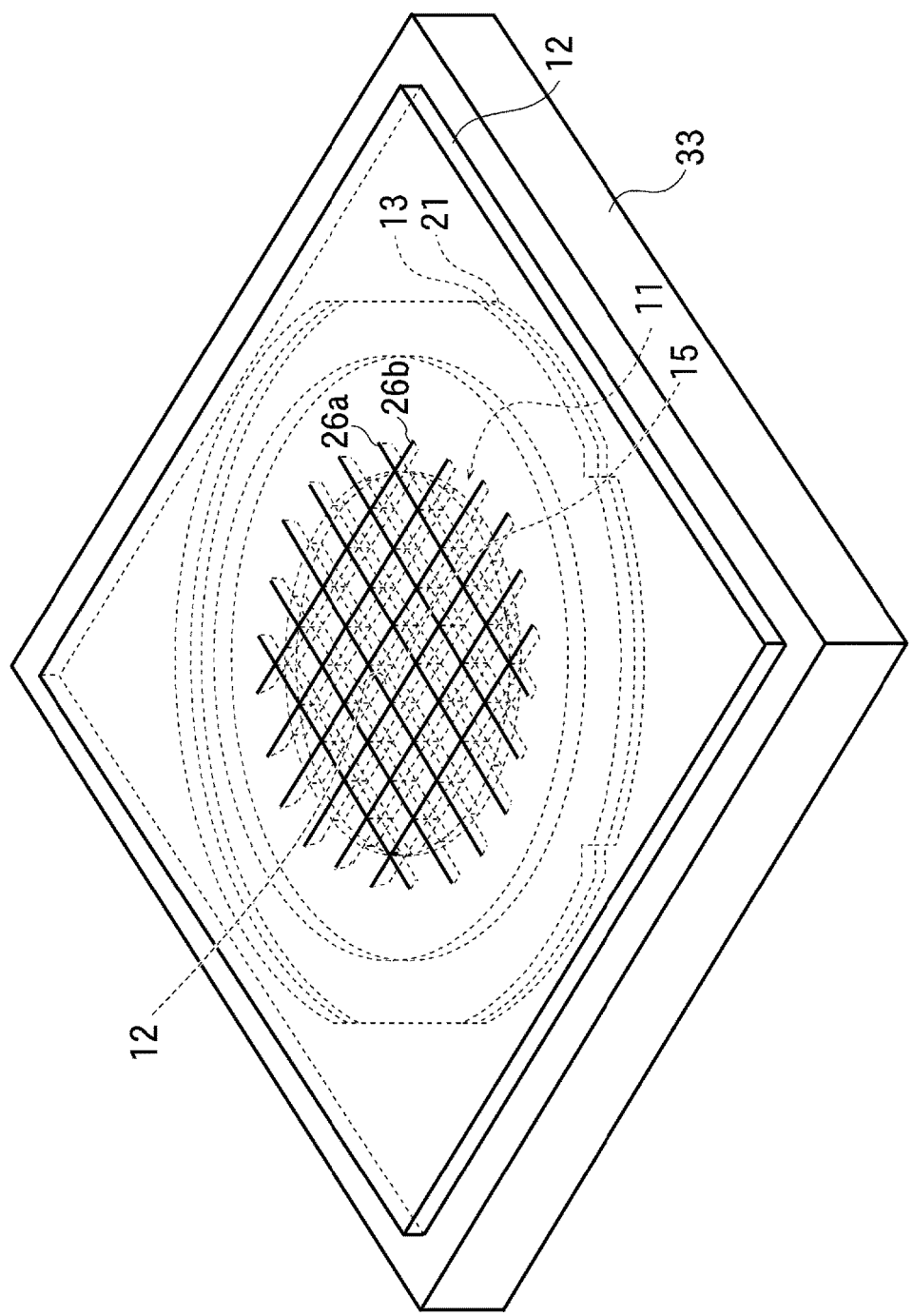
FIG. 4 is a perspective view schematically showing an example of a step of mounting a semiconductor chip on a circuit board.
Figure 8D:
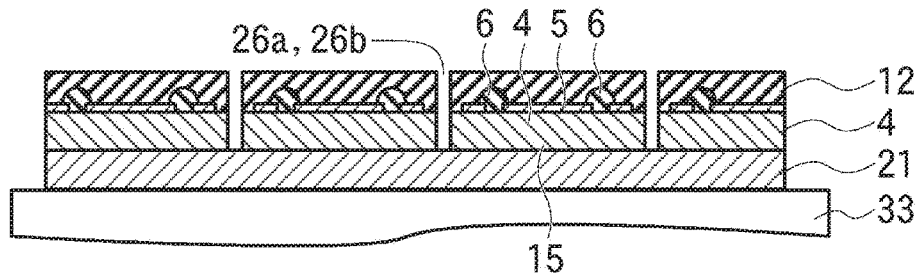

By cutting with such a blade 14, as shown in FIG. 4, when a plurality of parallel cut surfaces 26a and a plurality of cut surfaces 26b crossing the cut surfaces 26a at right angles are provided, the wafer 11 is divided into a plurality of semiconductor chips 15. Each semiconductor chip 15 is surrounded by four cut surfaces 26a and 26b, and is formed into a right-angled quadrilateral semiconductor chip 15. FIG. 8D is a cross-sectional view showing a state where the wafer 11 is divided into the semiconductor chips 15.

The underfill film 12 is cut together with the wafer 11, and the cut underfill film 12 is attached to the surface of the semiconductor chip 15. The back surface of each semiconductor chip 15 is attached to an uncut dicing film 21.

Figure 5:
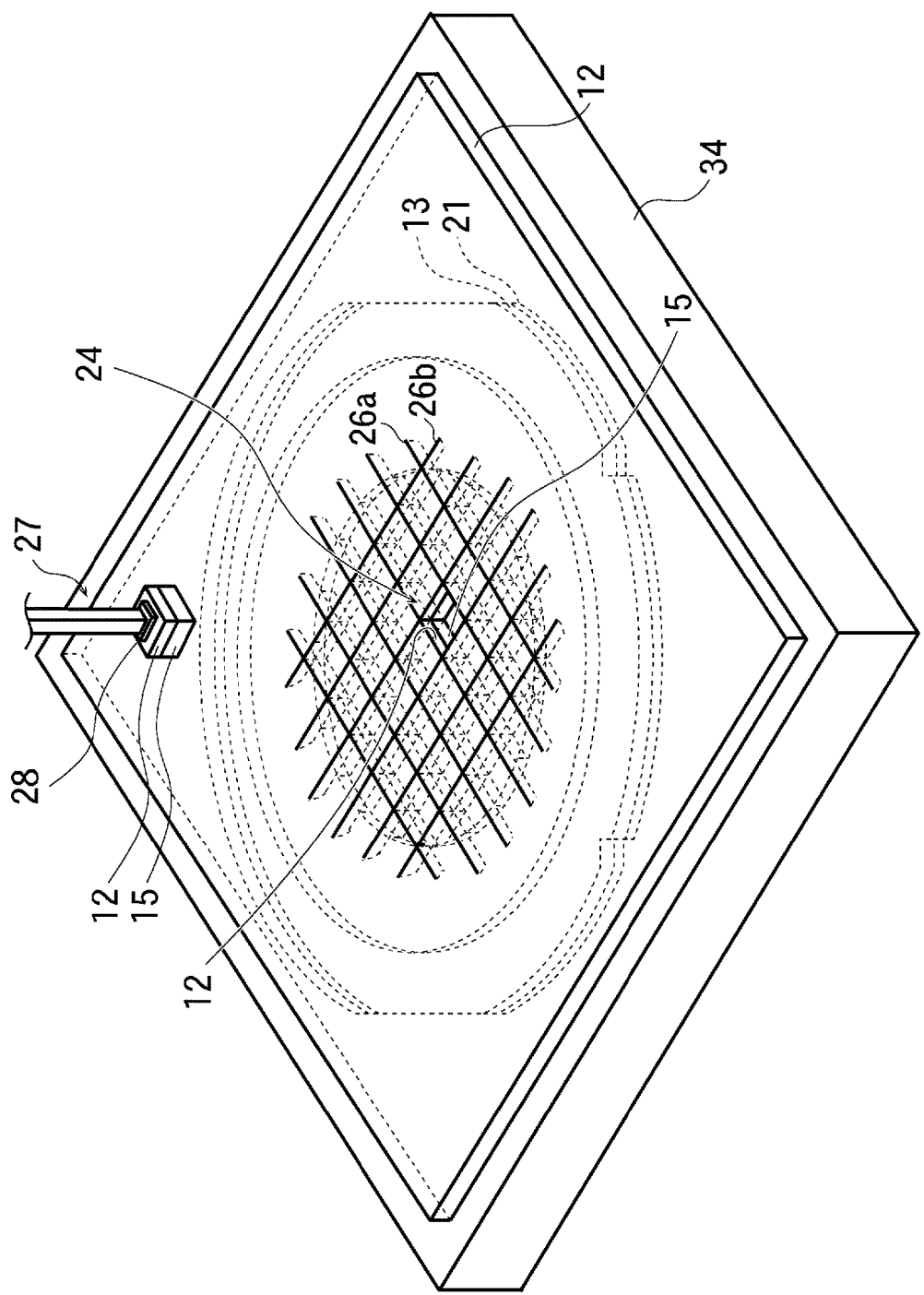
FIG. 5 is a perspective view for showing a pickup step.

FIG. 5 is a perspective view for showing a pick-up step of such a semiconductor chip 15. A suction pad 28 provided at a lower end of a pickup device 27 is brought into contact with the underfill film 12 on one of the cut semiconductor chips 15 to suction the underfill film 12. When a pin disposed below the bottom surface of the dicing film 21 is raised, the upper end of the pin penetrates the dicing film 21 and comes into contact with the bottom surface of the chip 15, the semiconductor chip 15 is pressed upward by the pin, and when the pickup device 27 is moved upward, the semiconductor chip 15 suctioned to the suction pad 28 is peeled off from the dicing film 21 and moved upward.

A reference numeral 24 denotes a cavity formed by the semiconductor chip 15 moved upward. The dicing film 21 is exposed at the bottom surface of the cavity 24, and the cut surface of the semiconductor chip 15 and the cut surface of the underfill film 12 which are positioned on the dicing film 21 are exposed at the side surfaces.

Next, the underfill film 12 on the surface of the semiconductor chip 15 faces the surface of the circuit board on which the semiconductor chip 15 is mounted, and the underfill film 12 is brought into contact with the circuit board.

Figure 9A:
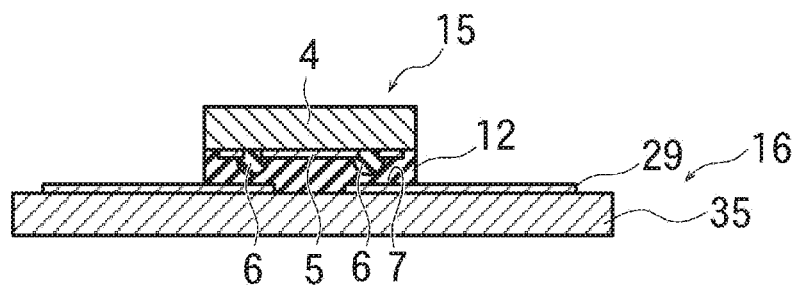
FIGS. 9A-9D are cross-sectional views for showing a mounting step.

A reference numeral 16 in FIG. 9A denotes a circuit board on which the semiconductor chip 15 is mounted, and the circuit board 16 includes a substrate body 35 and a metal wiring 29 provided on the surface of the substrate body 35. A part of the metal wiring 29 is a substrate electrode 7 electrically connected to the bump 6.

The substrate electrode 7 is disposed at a position corresponding to a pattern in which the bump 6 is disposed, and the semiconductor chip 15 is in contact with the underfill film 12 and the circuit board 16 after the bump 6 is positioned to face the substrate electrode 7 through the underfill film 12. A part of the underfill film 12 is in contact with the substrate body 35, and the other part is in contact with the metal wiring 29.

At this time, the underfill film 12 is positioned between the bump 6 and the substrate electrode 7, and the bump 6 and the substrate electrode 7 are not in contact with each other.

Figure 9B:
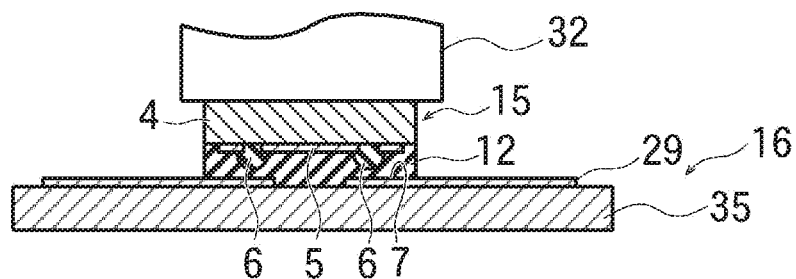

Next, a temporary fixing step of bringing the bump 6 and the substrate electrode 7 into contact with each other will be discussed. A reference numeral 32 in FIG. 9B is a heating piece 32 included in a die bonder device, and the heating piece 32 is configured to generate heat by flowing current by a heating power source, heat is generated by flowing a current, and the temperature of the heating piece 32 is increased. The heated heating piece 32 is brought into contact with the back surface of the semiconductor chip 15 by pressing, the semiconductor chip 15 is heated, and the temperature is increased, then the underfill film 12 in contact with the semiconductor chip 15 is heated to increase the temperature.

The acrylic polymer included in the underfill film 12 has a property of softening when the temperature is increased, and the viscosity of the heated underfill film 12 is smaller than the viscosity before the increase in the temperature.

When the viscosity of the underfill film 12 is reduced, underfill film 12 between the semiconductor chip 15 and the substrate electrode 7 is pushed out from between the semiconductor chip 15 and the substrate electrode 7 to the outside of the semiconductor chip 15 by the pressing force of the heating piece 32 to the semiconductor chip 15 ("pressing force" is a force for pressing, and is also referred to as "load"). As a result, the distance between the semiconductor chip 15 and the circuit board 16 is shortened, and the bump 6 comes in contact with the substrate electrode 7.

When the semiconductor chip 15 is heated by the heating piece 32, the bump 6 is heated at a temperature lower than the temperature at which the bump 6 is melted, and therefore the bump 6 is not melted.

Although the underfill film 12 is heated to a temperature lower than the temperature at which the monomer in the main composition causes a curing reaction, the adhesive force is developed on the surface of the underfill film 12, and thus, the semiconductor chip 15 is attached to the surface of the circuit board 16 by the adhesive force of the underfill film 12.

When the attachment due to softening of the underfill film 12 is referred to as a temporary fixing step, the temperature in the temporary fixing step is, for example, in a temperature range of at least 60° C. and at most 150° C. In addition, as the condition of the pressing force applied between the semiconductor chip 15 and the circuit board 16, the value of the pressing force to be applied can be set to, for example, at most 90 N, at most 70 N, or at most 40 N.

Figure 9C:
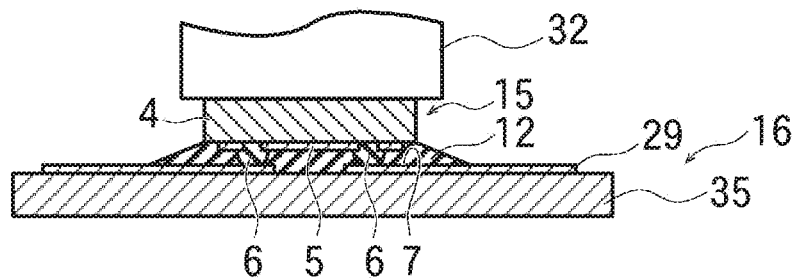

For the temporary fixing, the time condition for applying the pressing force while heating with a heating bonder can be set to a time range of at least 1 second and at most 120 seconds, for example. By these conditions, it is possible to set a state where the bump 6 is in contact with the substrate electrode 7 without melting bump 6 during the temporary fixing step while the heating bonder applies heating and pressure, and to set a state where the underfill film 12 is not cured. FIG. 9C shows a temporarily fixed state.

In the temporary fixing step, because the semiconductor chip 15 is temporarily fixed to the circuit board 16 at a low temperature, the generation of voids when the semiconductor chip 15 is adhered to the circuit board 16 is suppressed, and damage to the semiconductor chip 15 can be reduced.

Figure 6:
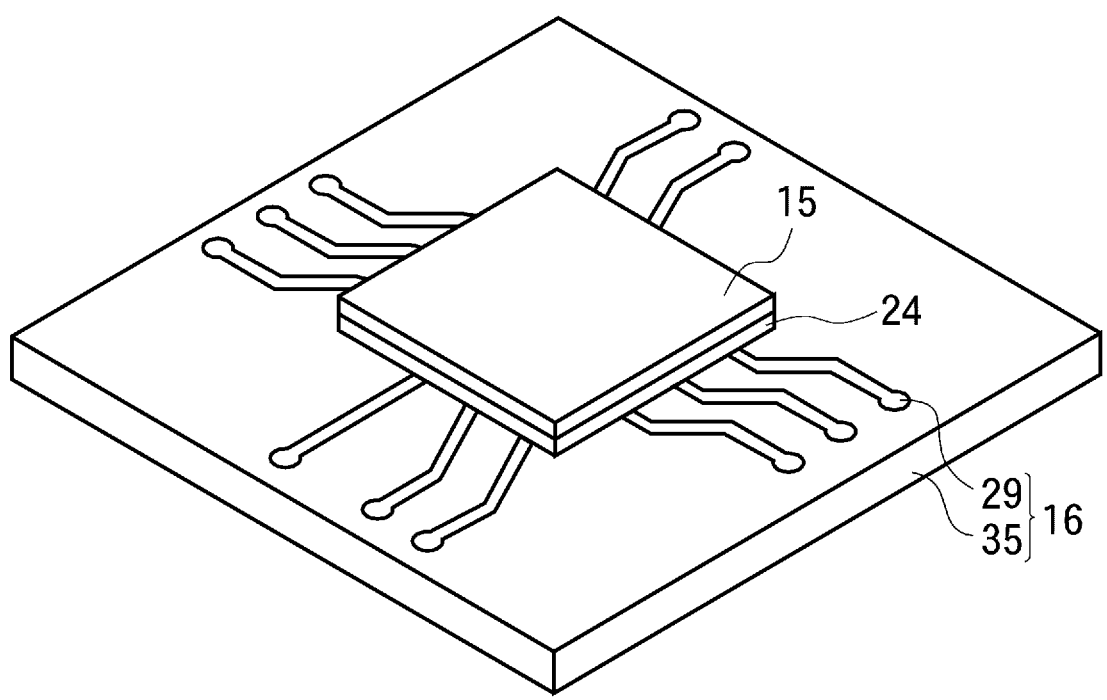
FIG. 6 is a perspective view of a semiconductor device.
Figure 9D:
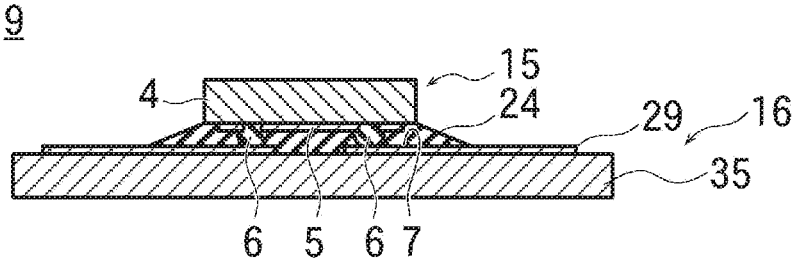

After the temporary fixing step, a mounting step of permanently fixing the semiconductor chip 15 to the circuit board 16 is performed. The bump 6 is formed of metal that is melted at a low temperature, and in the mounting step, for example, the semiconductor chip 15 temporarily fixed by the underfill film 12 and the circuit board 16 (the "assembly") are carried into a heated reflow furnace, the semiconductor chip 15, the underfill film 12, and the circuit board 16 (the assembly) are heated by the reflow furnace to increase the temperature to be a temperature higher than the temperature increased by the temporary fixing, and thereby the bumps 6 is melted. The melted bumps 6 come in contact with the substrate electrode 7, the assembly is taken out from the reflow furnace with the melted bumps 6 in the contacted state and is cooled down, and the bumps 6 are solidified in a state where a metal bond is formed with the substrate electrode 7. In the reflow furnace, when the composition of the heated underfill film 12 chemically reacts, the underfill film 12 is cured, the heated circuit board 16 and the semiconductor chip 15 are cooled, and a semiconductor device in which the semiconductor chip 15 is fixed and electrically connected to the circuit board 16 is obtained. A reference numeral 9 in FIG. 9D denotes a semiconductor device, and a reference numeral 24 denotes a cured underfill film. FIG. 6 is a perspective view of a semiconductor device 9.

Although the heating temperature condition in the mounting step depends on the kind of metal used for the bumps, such as a solder, for example, the bump 6 can be permanently fixed by being heated to a temperature range of at least 200° C. and at most 280° C. Further, the heating time condition can be, for example, in a time range of 5 seconds or more and 500 seconds or less. The bump 6 and the substrate electrode 7 are electrically and mechanically connected by the metal bond between the bump 6 and the substrate electrode 7, and the underfill film 12 is cured in a state where the semiconductor chip 15 and the circuit board 16 are adhered to each other, and thereby the permanent fixing is performed in a manner such that the semiconductor chip 15 is fixed and electrically connected to the circuit board 16.

As discussed above, the method for manufacturing the semiconductor device 9 according to the present embodiment includes the temporary fixing step of temporarily fixing the semiconductor chip 15 having the bumps 6 on the circuit board 16 through the above-discussed underfill film 12, and the mounting step of permanently fixing the semiconductor chip 15 to the circuit board 16. Because the semiconductor chip 15 is mounted on the circuit board 16 by the two steps of the temporary fixing step and the mounting step, the semiconductor chip 15 can be mounted with a relatively low pressing force (for example, at most 90 N).

That is, because the low-pressure mounting can be realized, the damage to the semiconductor chip 15 can be reduced.

EXAMPLES

Hereinafter, examples of the present embodiments will be discussed. The present invention is not limited to these examples.

[Evaluation]

The underfill material of the present embodiment is a composition constituting an underfill film, and includes an acrylic polymer, an acrylic monomer, and a maleimide compound.

The composition and evaluation results of the underfill material of the examples of the present embodiments are indicated in Table 1 below, and the composition and evaluation results of the underfill material of the comparative example are indicated in Table 2 below.

[Film Breaking Strength]

An underfill film (thickness of 40 μm) formed of the compositions indicated in Tables 1 and 2 was cut to a size of 1 cm×3 cm, and the underfill film was pulled at a tensile speed of 300 mm/min with a tensile and compression tester (Tensilon), a load when the underfill film was broken was measured, and the load/cross-sectional area was measured as the breaking strength. Practically, the value of the breaking strength is preferably in a range of at least 0.01 MPa and at most 5.0 MPa, and a case where the breaking strength was within this range was evaluated as acceptable, and the other was evaluated as unacceptable.

[Mounting Pressing Force]

The maximum pressing force (number of bumps 20,000) of the flip chip bonder from the start to the end of mounting was set as the pressing force for the temporary fixing. Practically, the pressing force for the temporary fixing is preferably at most 90 N, and more preferably at most 40 N.

[Void]

The presence or absence of voids was evaluated nondestructively using an ultrasonic imaging device (SAT: Scanning Acoustic Tomography). Specifically, after temporarily fixing the semiconductor chip to a test substrate electrode (TEG: Test Element Group) at a heating temperature of 260° C. and the pressing force indicated in Tables 1 and 2, the assembly was then heated for 4 hours by an oven heated to 200° C., and subsequently cooled and fixed permanently to prepare a sample. An ultrasonic image taken by the ultrasonic imaging device was observed. As a result of observing the image, the sample determined to have no white in the image was evaluated as acceptable, and the sample in which the white was observed was evaluated as unacceptable. In the "Voidless/SAT image" column of Tables 1 and 2 below, "OK" is described in a case where the evaluation result was acceptable, and "NG" is described in a case where the evaluation result was unacceptable.

[Connectivity (Conductivity)]

A daisy chain wiring pattern capable of confirming the electrical connection of the bumps of the semiconductor chip was provided as a TEG on the test substrate electrode, and the semiconductor chip was mounted on the TEG to confirm a connection state of the bumps. In a case where the connection of all conduction paths was able to be confirmed, it was evaluated as acceptable, and in a case where it was not possible to connect even at one location, it was evaluated as unacceptable. In the "Connectivity (Conductivity)" column of Tables 1 and 2 below, "OK" is described in a case where the evaluation result was acceptable, and "NG" is described in a case where the evaluation result was unacceptable.

[Determination]

Comprehensive determination was performed according to the following criteria.

A: The above-discussed evaluation results of film breaking strength, void, and connectivity were acceptable, and the pressing force was at most 40 N.

B: The above-described evaluation results of film breaking strength, void, and connectivity were acceptable, and the pressing force was greater than 40 N and at most 90 N.

C: At least one of the evaluation results of the film breaking strength, void and connectivity discussed above was unacceptable, or the pressing force was greater than 90N.

Example 1

[Preparation of Composition]

An acrylic polymer (Mw=1,000,000), an acrylic monomer (sold under the name: OGSOL EA0200, prepared by Osaka Gas Chemicals Co., Ltd.), a maleimide compound (sold under the name: BMI5100, prepared by Daiwa Kasei Industry Co., Ltd.), bisphenol (sold under the name: DABPA, prepared by Daiwa Kasei Industry Co., Ltd.), a filler (silica filler, sold under the name: MEK-AC-2140Z, prepared by Nissan Chemical Corporation.), and methyl ethyl ketone are weighed so as to have parts by mass (or content wt %) indicated in Table 1. Then, this composition was mixed and dispersed in a time range of 12 hours to 24 hours using a ball mill at room temperature to obtain a uniformly dissolved composition.

[Preparation of Underfill Film]

The obtained composition was applied to a release substrate with a comma coater (registered trademark) having a gap adjusted to have a predetermined sheet thickness, and continuously dried in an oven at 70° C. to prepare an underfill film. The drying time was in a range of about 3 minutes to 5 minutes, and the drying time was adjusted such that a solvent residue of the produced underfill film was at most 2 wt %.

[Mounting Step]

In order to bond the produced underfill film to the wafer, heat-attachment (60° C.) was performed under vacuum for 60 seconds using a diaphragm laminator (manufactured by Meiki Co., Ltd.), and thereby, a wafer with an underfill film was produced.

The wafer with an underfill film was diced into each chip size using a wafer dicing device (manufactured by DISCO Corporation) to produce a chip with an underfill film.

The chip with an underfill film was bonded, mounted, and soldered in a predetermined location after adjusting alignment of the circuit board using a flip chip bonder (manufactured by Panasonic Corporation).

Examples 2 to 8 and Comparative Examples 1 to 9

Underfill films of Examples 2 to 8 and Comparative Examples 1 to 9 were produced under the same conditions as in Example 1 except that the compositions were prepared with the contents indicated in Tables 1 and 2. In the tables below, the numerical values (for example, 100 for the acrylic polymer of Example 1) described in an upper part of the rows for the acrylic polymer, the acrylic monomer, and the maleimide compound, and the numerical values described in the rows for the filler and phenol compound, represent a compounding amount (parts by mass) of the components. Furthermore, in Tables 1 and 2 below, the numerical values (for example, 30.3 wt % in the acrylic polymer of Example 1) described in a lower part of the rows for the acrylic polymer, the acrylic monomer, and the maleimide compound represent the contents (wt %) which are values of parts by mass of the components with respect to the values of parts by mass of the total amount of the acrylic polymer, the acrylic monomer, and the maleimide compound in the underfill material.

On the other hand, in Examples 1 to 8, because the underfill material included the acrylic polymer in a range of at least 10 parts by mass and at most 60 parts by mass in 100 parts by mass of the main composition, and included the maleimide compound in a range of at least 20 parts by mass

TABLE 1

Compositions of the underfill material of the embodiments, and conditions of manufacturing step of semiconductor device, and measured results

|  |  |  | Example 1 | Example 2 | Example 3 | Example 4 | Example 5 | Example 6 | Example 7 | Example 8 |
|---|---|---|---|---|---|---|---|---|---|---|
| Underfill material | Acrylic polyer | Mw = 1000000 | 100<br>30.3 wt % | 100<br>33.3 wt % | 100<br>21.3 wt % | 100<br>30.3 wt % | 200<br>46.5 wt % | 100<br>38.5 wt % | 100<br>34.5 wt % | 60<br>19.4 wt % |
|  | Acrylic monomer | EA0200 | 150<br>45.5 wt % | 100<br>33.3 wt % | 250<br>53.2 wt % | 110<br>33.3 wt % | 110<br>25.6 wt % | 80<br>30.8 wt % | 40<br>13.8 wt % | 100<br>32.3 wt % |
|  | Maleimide compound | BMI5100 | 80<br>24.2 wt % | 100<br>33.3 wt % | 120<br>25.5 wt % | 120<br>36.4 wt % | 120<br>27.9 wt % | 80<br>30.8 wt % | 150<br>51.7 wt % | 150<br>48.4 wt % |
|  | Filler | MEK-AC-2140Z | 100 | 100 | 100 | 100 | 100 | — | 100 | 100 |
|  | Phenol compound | DABPA | 20 | — | 10 | 30 | 30 | 20 | 40 | 40 |
| Evaluation | Breaking strength(Mpa) |  | 0.5 | 0.8 | 0.5 | 0.5 | 0.8 | 0.9 | 0.6 | 0.4 |
|  | Pressing force(N)/20000bumps |  | 40 | 90 | 90 | 70 | 70 | 90 | 40 | 40 |
|  | Voidless/SAT image |  | OK | OK | OK | OK | OK | OK | OK | OK |
|  | Connectivity(conductivity) |  | OK | OK | OK | OK | OK | OK | OK | OK |
|  | Determination |  | A | B | B | B | B | B | A | A |

In the colums of underfill material, value without unit is Parts by mass.

TABLE 2

Compositions of the underfill material of the comparative examples, and conditions of manufacturing step of semiconductor device, and measured results

|  |  |  | Comparative example 1 | Comparative example 2 | Comparative example 3 | Comparative example 4 | Comparative example 5 |
|---|---|---|---|---|---|---|---|
| Underfill material | Aerylic polyer | Mw = 1000000 | 20<br>8 wt % | 250<br>52.1 wt % | 100<br>28.6 wt % | 100<br>38.5 wt % | 100<br>64.5 wt % |
|  | Aerylic monomer | EA0200 | 150<br>60 wt % | 150<br>31.3 wt % | —<br>— | 150<br>57.7 wt % | 15<br>9.1 wt % |
|  | Maleimide compound | BMI5100 | 80<br>32 wt % | 80<br>16.7 wt % | 250<br>71.4 wt % | 10<br>3.8 wt % | 40<br>24.2 wt % |
|  | Filler | MEK-AC-2140Z | 100 | 100 | 100 | 100 | 100 |
|  | Phenol compound | DABPA | 20 | 20 | — | 5 | 10 |
| Evaluation | Breaking stregth(Mpa) |  | 0.2 | 1.5 | 1.0 | 0.7 | 2.8 |
|  | Pressing force(N)/20000 bump |  | 80 | 180 | 100 | 100 | 300 |
|  | Voidless/SAT image |  | NG | OK | NG | OK | OK |
|  | Connectivity(conductivity) |  | OK | NG | NG | NG | NG |
|  | Determination |  | C | C | C | C | C |

|  |  |  | Comparative example 6 | Comparative example 7 | Comparative example 8 | Comparative example 9 |
|---|---|---|---|---|---|---|
| Underfill material | Aerylic polyer | Mw = 1000000 | 30<br>10 wt % | 20<br>9.1 wt % | 200<br>61.5 wt % | 50<br>12.5 wt % |
|  | Aerylic monomer | EA0200 | 20<br>6.7 wt % | 150<br>68.2 wt % | 75<br>23.1 wt % | 50<br>12.5 wt % |
|  | Maleimide compound | BMI5100 | 250<br>83.3 wt % | 50<br>22.7 wt % | 50<br>15.4 wt % | 300<br>75 wt % |
|  | Filler | MEK-AC-2140Z | 100 | 100 | 100 | 100 |
|  | Phenol compound | DABPA | 10 | 20 | — | — |
| Evaluation | Breaking strength(Mpa) |  | 0.7 | 0.3 | 0.9 | 0.3 |
|  | Pressing force(N)/20000 bump |  | 40 | 70 | 100 | 100 |
|  | Voidless/SAT image |  | NG | NG | OK | NG |
|  | Connectivity(conductivity) |  | OK | OK | NG | OK |
|  | Determination |  | C | C | C | C |

In the colums of underfill material, value without unit is Parts by mass.

In Comparative Examples 1 to 9, because the underfill material either did not include the acrylic polymer in a range of at least 10 parts by mass and at most 60 parts by mass in 100 parts by mass of the main composition, and/or did not include the maleimide compound in a range of at least 20 parts by mass and at most 70 parts by mass in 100 parts by mass of the main composition, it was not possible to achieve the low-pressure mounting and voidless mounting.

and at most 70 parts by mass in 100 parts by mass of the main composition, it was possible to achieve the low-pressure mounting and voidless mounting.

REFERENCE SIGNS LIST

6 Bump
7 Substrate electrode
9 Semiconductor device

11 Wafer
12 Underfill film
13 Jig
15 Semiconductor chip
16 Circuit board

The invention claimed is:

1. An underfill material that is an uncured underfill material arranged between a semiconductor chip and a circuit board, and that fixes the semiconductor chip to the circuit board when cured, the underfill material comprising:
   a main composition consisting of an acrylic polymer, an acrylic monomer, and a maleimide compound,
   wherein:
   the acrylic polymer is included in a range of at least 10 parts by mass and at most 60 parts by mass in 100 parts by mass of the main composition, and
   the maleimide compound is included in a range of at least 20 parts by mass and at most 70 parts by mass in 100 parts by mass of the main composition.

2. The underfill material according to claim 1, wherein the acrylic monomer is included in the range of at least 10 parts by mass and at most 60 parts by mass in 100 parts by mass of the main composition.

3. The underfill material according to claim 1, wherein the acrylic polymer in the main composition has a weight-average molecular weight Mw in a range of at least 100,000 and at most 1,200,000.

4. The underfill material according to claim 2, wherein the acrylic polymer in the main composition has a weight-average molecular weight Mw in a range of at least 100,000 and at most 1,200,000.

5. The underfill material according to claim 1, wherein the acrylic monomer includes a fluorene acrylate.

6. The underfill material according to claim 1, wherein the maleimide compound includes at least two maleimide groups in one molecule.

7. The underfill material according to claim 1, wherein the maleimide compound is bismaleimide.

8. The underfill material according to claim 1, further comprising a phenol compound.

9. An underfill film that is an uncured underfill film arranged between a semiconductor chip and a circuit board, and that fixes the semiconductor chip to the circuit board when cured, and the underfill film comprising:
   a main composition consisting of an acrylic polymer, an acrylic monomer, and a maleimide compound,
   wherein:
   the acrylic polymer is in a range of at least 10 parts by mass and to at most 60 parts by mass in 100 parts by mass of the main composition, and
   the maleimide compound is in a range of at least 20 parts by mass and at most 70 parts by mass in 100 parts by mass of the main composition.

10. The underfill film according to claim 9, wherein the acrylic monomer is included in the range of at least 10 parts by mass and at most 60 parts by mass in 100 parts by mass of the main composition.

11. The underfill film according to claim 9, wherein the acrylic polymer in the main composition has a weight average molecular weight Mw in a range of at least 100,000 and at most 1,200,000.

12. The underfill film according to claim 9, wherein the acrylic monomer includes a fluorene acrylate.

13. The underfill film according to claim 9, wherein the maleimide compound includes at least two maleimide groups in one molecule.

14. The underfill film according to claim 9, wherein the maleimide compound is bismaleimide.

15. The underfill film according to claim 9, further comprising a phenol compound.

16. The underfill film according to claim 9, wherein the underfill film has a tensile breaking strength in a range of at least 0.01 MPa and at most 5.0 Mpa.

17. A method for manufacturing a semiconductor device, the method comprising:
   disposing an uncured underfill film between a surface of a semiconductor chip on which a bump is provided and a surface of a circuit board, and adhering the semiconductor chip and the circuit board using the underfill film,
   wherein:
   the uncured underfill film comprises a main composition consisting of an acrylic polymer, an acrylic monomer, and a maleimide compound,
   the acrylic polymer is included in a range at least of 10 parts by mass and at most 60 parts by mass in 100 parts by mass of the main composition, and
   the maleimide compound is included in a range of at least 20 parts by mass and at most 70 parts by mass in 100 parts by mass of the main composition.

18. The method for manufacturing a semiconductor device according to claim 17, the method further comprising:
   a temporary fixing step of heating at an increased temperature and pressing the semiconductor chip to the circuit board in a state where the underfill film is disposed between the semiconductor chip and the circuit board, pushing out a part of the underfill film positioned between the semiconductor chip and the circuit board from between the semiconductor chip and the circuit board, and bringing a bump of the semiconductor chip into contact with a substrate electrode of the circuit board; and
   a mounting step of increasing temperatures of the semiconductor chip, the circuit board, and the underfill film higher than the increased temperature in the temporary fixing step, melting the bump, and then decreasing the temperature of the semiconductor chip, the underfill film, and the circuit board, and solidifying the melted bump in a state that the bump is in contact with the substrate electrode.

* * * * *